(12) United States Patent
Kohara et al.

(10) Patent No.: US 6,624,462 B1
(45) Date of Patent: Sep. 23, 2003

(54) DIELECTRIC FILM AND METHOD OF FABRICATING THE SAME

(75) Inventors: Naoki Kohara, Osaka (JP); Taisuke Sawada, Osaka (JP); Masatoshi Kitagawa, Osaka (JP); Takeshi Uenoyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/640,520

(22) Filed: Aug. 17, 2000

(30) Foreign Application Priority Data

Aug. 20, 1999 (JP) .......................................... 11-233817

(51) Int. Cl.$^7$ ............................................ H01L 21/331
(52) U.S. Cl. ........................ 257/310; 438/3; 438/240; 438/957; 257/295; 257/310
(58) Field of Search .................. 438/3, 240, 957; 257/40, 310; 427/100

(56) References Cited

U.S. PATENT DOCUMENTS

| | | | |
|---|---|---|---|
| 4,734,390 A | * 3/1988 | Marchand et al. | 361/321.5 |
| 4,888,246 A | * 12/1989 | Kuwata et al. | 204/192.15 |
| 5,043,049 A | * 8/1991 | Takenaka | 204/192.15 |
| 6,127,218 A | * 10/2000 | Kang | 438/240 |
| 6,340,621 B1 | * 1/2002 | Anderson et al. | 438/3 |

FOREIGN PATENT DOCUMENTS

| | | |
|---|---|---|
| JP | 61-269804 | 11/1986 |
| JP | 2186614 A | 7/1990 |
| JP | 9153598 A | 10/1997 |

OTHER PUBLICATIONS

N. Kohara et al., "Improvement of Properties of SrTiO$_3$ Thin Films Deposited At Low Temperature and High Rate By Sputtering Gas", Jpn. J. Appl. Phys. vol. 39 (2000), Part 1, No. 6A, pp. 3519–3523, Jun. 2000.

* cited by examiner

Primary Examiner—Matthew Smith
Assistant Examiner—Belur Keshavan
(74) Attorney, Agent, or Firm—Nixon Peabody LLP; Donald R. Studebaker

(57) ABSTRACT

A Pt/Ti film is formed on a substrate, and the Pt/Ti film is patterned in to a bottom electrode. Subsequently, a SrTiO$_3$ film, that is, a dielectric film, is formed on the substrate by sputtering using a mixture of an Ar gas, an O$_2$ gas and a N$_2$ gas as a film forming gas. The SrTiO$_3$ film is patterned into a capacitor dielectric film formed on the bottom electrode. A top electrode is then formed on the capacitor dielectric film. Since a N$_2$ gas is used as the film forming gas in addition to an Ar/O$_2$ gas, a SrTiO$_3$ film with a high dielectric constant and small leakage can be formed at a low temperature. By using this SrTiO$_3$ film, a thin film capacitor with high capacitance and good dielectric characteristics can be obtained.

4 Claims, 12 Drawing Sheets

○ :Sr  ● :Ti  ⊘ :O  ⊗ :N  ○ :Hole

Ar/O₂/N₂ gas

Ar/O₂ gas

DIELECTRIC FILM AND METHOD OF FABRICATING THE SAME

BACKGROUND OF THE INVENTION

The present invention relates to a dielectric film having an $ABO_3$ perovskite structure with a high dielectric constant suitably used as a dielectric film for sandwiching upper and lower conducting electrodes in a thin film capacitor and a method of fabricating the dielectric film.

Recently, electronic equipment is desired to have small size and thickness. Electronic equipment includes a circuit substrate or the like mounting electronic components (elements) such as an IC and a capacitor, and therefore, an electronic component and a circuit substrate used in electronic equipment are also required to have small area and thickness. Among such electronic components (elements), a capacitor in particular occupies a large area, and hence, reduction in its area can lead to a great effect in reducing the area and the thickness of the electronic component.

On the other hand, a memory utilizing charge and polarization of a capacitor is remarkably widely used these days, and various structures have been proposed for a capacitor. For example, in order to realize a compact and thin capacitor, not only a semiconductor substrate is used but also a compact, light and inexpensive substrate, such as glass, ceramics, a metallic foil and a flexible organic polymer film, is used, so as to provide a compact and light thin film capacitor having a laminated structure including electrode thin films and a highly dielectric thin film.

In particular, a dielectric film having a perovskite structure whose stoichiometric composition is represented by $ABO_3$ (wherein A and B are metal atoms) has a large dielectric constant and is a significant material in reducing the area and the size of the electronic component. Also, a dielectric film having the perovskite structure has, depending upon its orientation and kind, a hysteresis characteristic that predetermined polarization remains after removal of voltage application, and hence, such a dielectric film can function as a ferroelectric film. Since $SrTiO_3$ (namely, so-called STO), that is, one of dielectrics having the perovskite structure, has a comparatively large dielectric constant, its use in a thin film capacitor for a non-contact IC card is now increasing.

A dielectric film having the perovskite structure is generally formed by CVD such as so-called MOCVD utilizing a reaction of an organic metal, and is sometimes formed by sputtering, deposition or the like for the purpose of improving through-put and reducing fabrication cost.

Although a dielectric film having the perovskite structure has the aforementioned good characteristics but also has unsolved problems as follows:

First, although a dielectric film having the perovskite structure has a large dielectric constant and a ferroelectric property, it is known that these dielectric characteristics depend upon the crystallinity of the dielectric film. It is known, for example, that the dielectric constant and residual polarization can be lowered when the dielectric film is poor at the crystallinity and the orientation. When the sputtering is employed for the purpose of fabricating an inexpensive thin film capacitor, the composition of the dielectric film is often shifted from the stoichiometric composition, and in such a case, the crystallinity is degraded. As a result, the desired dielectric characteristics cannot be always attained.

Also, when the thickness of the dielectric film is reduced so as to reduce the thickness of the element and increase the capacitance, a leakage current tends to unavoidably increase. In particular, when a dielectric film having the $ABO_3$ perovskite structure includes a large number of crystal defects, much leakage occurs. Such crystal defects include loss of an oxygen atom (O) (oxygen loss) in a crystal lattice of the perovskite structure represented by $ABO_3$ and shift of the existing ratio between the metal atoms A and B from 1:1. These crystal defects can result in various problems, and for example, breakdown can easily occur in the dielectric film, data stored in the dielectric film serving as a memory can be easily volatized, or when the dielectric film is used as a ferroelectric film, sufficient polarization cannot be attained by applying a voltage.

These problems are particularly conspicuous when the dielectric film is formed by sputtering or deposition carried out at a low temperature. In other words, when the dielectric film is formed at a high deposition rate, in particular, at a low temperature by the sputtering or deposition so as to improve the through-put for the purpose of lowering the fabrication cost, a phenomenon such as degradation in the crystallinity and occurrence of crystal defects can be easily caused. In fabrication of a thin film capacitor formed on a flexible organic film with low heat resistance as in application to an IC card or the like, the dielectric film is unavoidably formed at a low temperature. Accordingly, it is difficult to fabricate, at low cost, a thin film capacitor including a dielectric film with the $ABO_3$ perovskite structure, such as an STO film, formed on a substrate with low heat resistance.

An object of the invention is providing a dielectric film having the $ABO_3$ perovskite structure that can be fabricated at low cost with keeping good dielectric characteristics such as a leakage characteristic, and a method of fabricating the dielectric film.

SUMMARY OF THE INVENTION

The dielectric film of this invention has a perovskite structure with a stoichiometric composition represented by $ABO_3$, including a group II element A, a group IV element B and oxygen O, and the perovskite structure includes nitrogen.

Accordingly, owing to nitrogen included in the perovskite structure, leakage caused in applying a voltage to the dielectric film upward or downward can be reduced. Also, the dielectric film can attain improved crystallinity and minuteness. Therefore, other characteristics, such as a dielectric constant, residual polarization in applying a voltage to the dielectric film upward or downward, and dielectric loss, can be improved.

In the dielectric film, the nitrogen is bonded to at least one of the element A and the element B. Therefore, an effect to suppress electron tunneling can be definitely attained.

In the dielectric film, the nitrogen is included in the perovskite structure in a concentration of 5at % or less. Therefore, a problem caused by excessive nitrogen can be avoided.

In the dielectric film, the element A is at least one material selected from the group consisting of Sr, Ba, Bi, La and Pb and the element B is at least one material selected from the group consisting of Ti, Ca, Nb, and Zr. Therefore, the invention is applicable to a widely used dielectric film having a perovskite structure.

The dielectric film of this invention may function as a capacitor dielectric film of a capacitor disposed on a substrate made from an organic material, namely, a capacitor formed on a so-called flexible substrate. Thus, a capacitor dielectric film made from a dielectric film with a high dielectric constant can be realized at low cost. In other words, a high quality and highly reliable thin film capacitor with large capacitance, small loss, a small leakage current and a high breakdown voltage can be obtained.

The first method of this invention of fabricating a dielectric film having a perovskite structure with a stoichiometric composition represented by $ABO_3$, including a group II element A, a group IV element B and oxygen O, comprises a step (a) of supplying a gas including an element lighter than Ar and a gas including oxygen into a chamber; and a step (b) of depositing the dielectric film having the perovskite structure including the element A, the element B and oxygen on an object surface by drawing atoms of the element A and atoms of the element B from a metal material into a space within the chamber.

In this method, the existing ratio between the atoms of the element A and the atoms of the element B drawn into the space within the chamber can be adjusted, even at a low temperature, so as to attain a condition for forming a dielectric film having a composition close to the stoichiometric composition of the $ABO_3$ perovskite structure. Accordingly, a dielectric film good at dielectric characteristics can be formed on a substrate with low heat resistance.

In the first method, an Ar gas may be supplied into the chamber in addition to the gas including an element lighter than Ar in the step (a). In this manner, the existing ratio between the atoms of the element A and the atoms of the element B drawn into the space within the chamber can be more easily adjusted to fall within an appropriate range also by utilizing comparatively heavy Ar atoms.

It is experimentally confirmed that a mixed gas including an Ar gas, an oxygen gas and a nitrogen-containing gas is preferably supplied into the chamber in the step (a).

When the atoms of the element A and the element B are drawn into the space within the chamber by sputtering from the metal material in the step (b), the deposition rate for the dielectric film can be increased, which can make the method suitable to mass-production.

When the dielectric film is deposited at a rate of 10 nm/min. or more in the step (b), the productivity is improved, resulting in forming the dielectric film at low cost.

When the object surface used in the step (b) is a top surface of a metal electrode disposed on a substrate made from an organic material, a dielectric film with good characteristics can be formed on a flexible substrate or the like at a low temperature. As a result, an inexpensive capacitor can be fabricated by using the dielectric film of this invention. In other words, the method is applicable to fabrication of a high quality and highly reliable thin film capacitor with large capacitance, small loss, a small leakage current and a high breakdown voltage.

The second method of this invention of fabricating a dielectric film having a perovskite structure with a stoichiometric composition represented by $ABO_3$, including a group II element A, a group IV element B and oxygen O, comprises a step (a) of supplying at least two kinds of sputtering gases having different weights and an oxygen-containing gas into a chamber; a step (b) of setting the two kinds of sputtering gases and the oxygen-containing gas to a plasma state; and a step (c) of depositing the dielectric film having the perovskite structure including the element A, the element B and oxygen on an object surface by striking a target material with atoms of the two kinds of sputtering gases in a plasma state so as to draw atoms of the element A and atoms of the element B into a space within the chamber.

In this method, the elements A and B are sputtered by the at least two kinds of gases having different weights, and hence, a ratio in the sputtered amount between the elements A and B can be varied by varying the flow ratio between the two kinds of gases. Specifically, by adjusting the flow ratio of the at least two kinds of gases, the existing ratios between the elements A and B can be adjusted to be optimal for attaining the stoichiometric composition.

In the second method, the two kinds of sputtering gases are preferably inert gases.

DETAILED DESCRIPTION OF THE INVENTION EMBODIMENT 1

Figure 1:
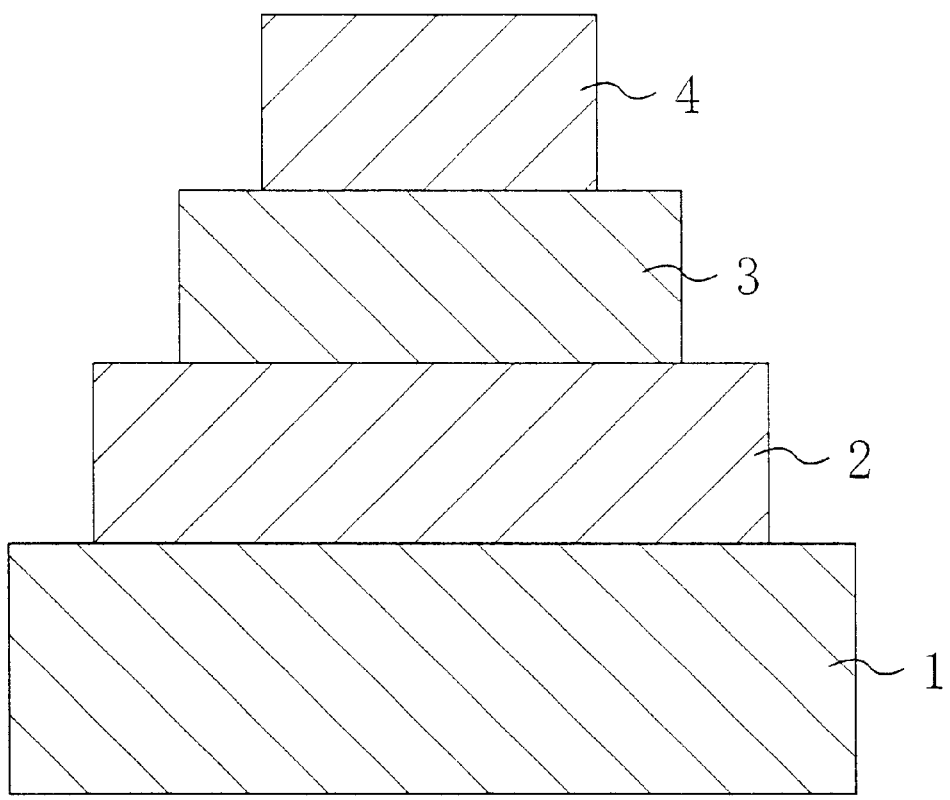
FIG. 1 is a cross-sectional view of a thin film capacitor according to Embodiment 1 of the invention.

FIG. 1 is a sectional view for showing the structure of a thin film capacitor according to Embodiment 1. As is shown in FIG. 1, the thin film capacitor of this embodiment includes a bottom electrode 2 of a Pt/Ti laminated film disposed on a substrate 1 of a boro-silicated glass, a capacitor dielectric film 3 of a $SrTiO_3$ film disposed on the bottom electrode 2, and a top electrode 4 of a Pt film disposed on the capacitor dielectric film 3. In other words, the thin film capacitor has a structure in which the capacitor dielectric film 3 is sandwiched between the bottom electrode 2 and the top electrode 4.

Next, a method of fabricating the thin film capacitor of this embodiment will be described. FIGS. 2(a) through 2(e) are sectional views for showing procedures in the fabrication of the thin film capacitor of this embodiment.

Figure 2A:
FIGS. 2(a), 2(b), 2(c), 2(d) and 2(e) are cross-sectional views for showing procedures in fabrication of the thin film capacitor of Embodiment 1.

First, in the procedure shown in FIG. 2(a), a substrate 1 of a boro-silicated glass with a thickness of 0.5 mm is prepared, and a Pt/Ti film 10 to be formed into a bottom electrode is formed on the substrate 1 by DC sputtering. The DC sputtering is carried out, for example, within a high vacuum chamber evacuated to a level of $10^{-6}$ Torr (0.0013Pa) in an atmosphere of Ar at DC power of 200 W, at a film forming pressure of $8 \times 10^{-3}$ Torr (1.1 Pa) and at a temperature of the substrate of 25° C. In the Pt/Ti film 10, a Pt film has a thickness of 100 nm and a Ti film has a thickness of 10 nm. Furthermore, these films are both deposited at a deposition rate of approximately 10 nm/min.

Figure 2B:
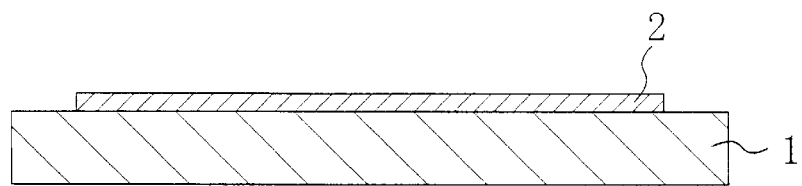

Next, in the procedure shown in FIG. 2(b), the Pt/Ti film is patterned by using a metal mask, thereby forming a bottom electrode 2 on the substrate 1. The bottom electrode 2 has a size of approximately 5×5 mm.

Figure 2C:
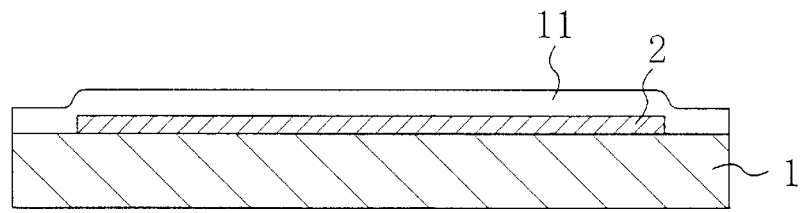

Then, in the procedure shown in FIG. 2(c), a SrTiO$_3$ film 11, that is, a dielectric film to be formed into a capacitor dielectric film, is formed on the substrate by RF magnetron sputtering. In forming the SrTiO$_3$ film 11, a mixture of an Ar gas, an O$_2$ gas and a N$_2$ gas is used as a film forming gas. Specifically, Ar ions generated by plasma are allowed to strike Sr and Ti targets, so that Sr atoms and Ti atoms can be sputtered owing to a momentum exchange function. As a result, O atoms included in the atmosphere and the sputtered Sr and Ti atoms are deposited on the substrate, thereby forming the SrTiO$_3$ film. As the conditions for the sputtering, the pressure within the chamber is reduced to high vacuum at a level of $10^{-6}$ Torr (0.13 mPa), the film forming pressure is set to $8 \times 10^{-3}$ Torr (1.1 Pa), the RF power is set to 200 W and the temperature of the substrate is set to 200° C.

In this embodiment, the SrTiO$_3$ film is formed by the sputtering conducted within a film forming gas including Ar, O$_2$ and N$_2$ in a mixing ratio of 2:1:0.5. The SrTiO$_3$ film 11 has a thickness of approximately 300 nm, and the deposition rate is approximately 3.0 nm/min.

Figure 2D:
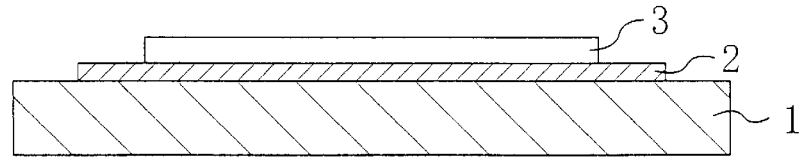

Next, in the procedure shown in FIG. 2(d), the SrTiO$_3$ film 11 is patterned, thereby forming a capacitor dielectric film 3 on the bottom electrode 2. The capacitor dielectric film 3 has a size of approximately 4×4 mm.

Figure 2E:
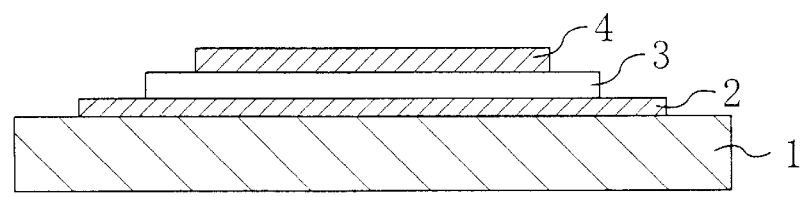

Then, in the procedure shown in FIG. 2(e), a Pt film is deposited on the substrate by DC magnetron sputtering, and the Pt film is patterned into a top electrode 4 disposed on the capacitor dielectric film 3. The Pt film to be formed into the top electrode 4 is deposited under the same conditions as in depositing the Pt film included in the bottom electrode 2. The top electrode 4 has a plane size of approximately 3×3 mm. Accordingly, a portion of the capacitor dielectric film 3 sandwiched between the bottom electrode 2 and the top electrode 4 has a size of approximately 3×3 mm.

In the fabrication method of this embodiment, a N$_2$ gas is used in addition to an Ar/O$_2$ gas as the film forming gas. Therefore, as compared with the case where an Ar/O$_2$ gas alone is used as the film forming gas, the SrTiO$_3$ film can attain a large dielectric constant and less leakage. Since such a SrTiO$_3$ film is used, the thin film capacitor can attain good characteristics as described in detail below.

Comparison in Characteristics Between Embodiment and Comparative Example

In order to compare the SrTiO$_3$ film formed as described above and the thin film capacitor using the SrTiO$_3$ film with a conventional product, a SrTiO3 film is formed as a comparative example by using a mixed gas including Ar and O$_2$ in a ratio of 2:1 as the film forming gas in the procedure shown in FIG. 2(c). This SrTiO$_3$ film has a thickness of approximately 300 nm, and the deposition rate is approximately 3.5 nm/min. Now, results of various evaluations will be described for comparing the SrTiO$_3$ films of this embodiment and the comparative example in their structures and characteristics.

Figure 3A:
FIGS. 3(a) and 3(b) are diagrams of images obtained through analysis, with a scanning electron microscope (SEM), of surfaces of $SrTiO_3$ films of a comparative example and Embodiment 1.
Figure 3B:
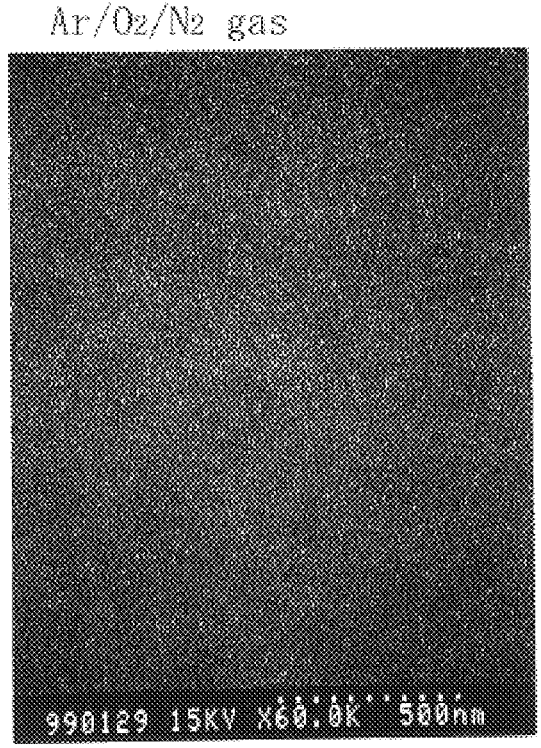

FIGS. 3(a) and 3(b) are diagrams of images obtained through analysis with a scanning electron microscope (SEM) of the surfaces of the SrTiO$_3$ films in the laminated films having a Pt/SrTiO$_3$/Pt/Ti/glass structure formed in the comparative example and this embodiment. FIG. 3(a) reveals that the SrTiO$_3$ film formed by using the Ar/O$_2$ gas as the film forming gas has large irregularities on the surface and rough grain boundaries. In contrast, FIG. 3(b) reveals that the SrTiO$_3$ film formed by using the Ar/O$_2$/N$_2$ gas as the film forming gas has small irregularities on the surface and minute grain boundaries.

Figure 4A:
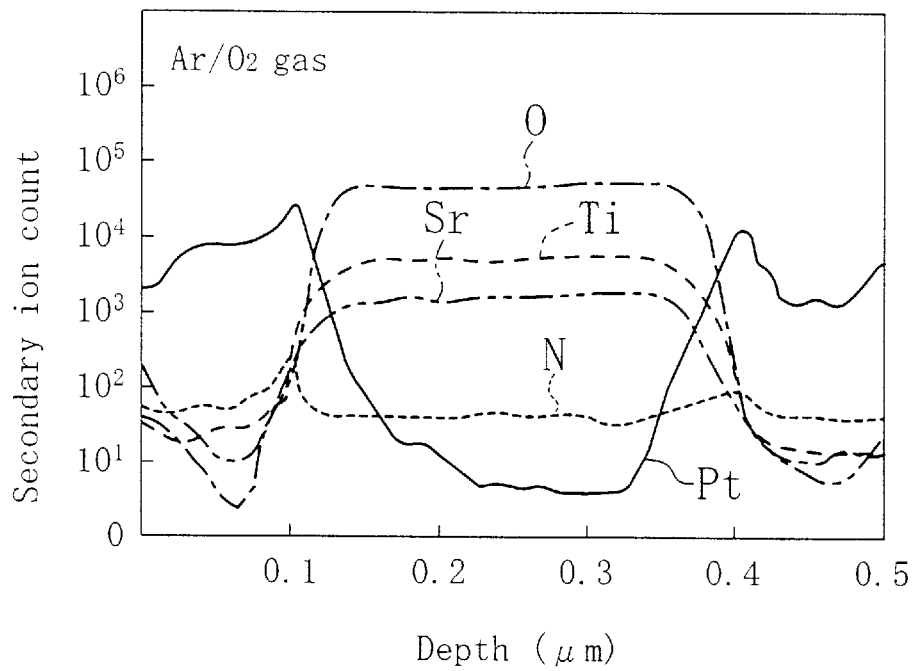
FIGS. 4(a) and 4(b) are diagrams of profiles obtained through analysis with SIMS of change in components along a depth direction in the $SrTiO_3$ films of the comparative example and Embodiment 1.
Figure 4B:
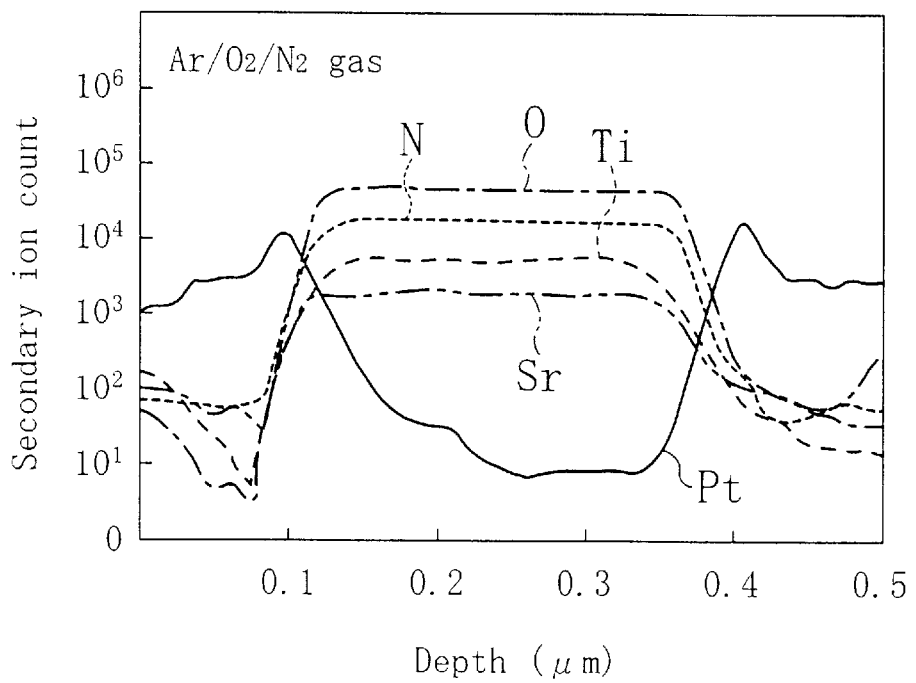

FIGS. 4(a) and 4(b) are diagrams of profiles obtained through analysis with secondary ion mass spectrometry (SIMS) of change in composition along the depth direction in the laminated films having the Pt/SrTiO$_3$/Pt/Ti/glass structure formed in the comparative example and this embodiment. FIG. 4(a) reveals that the SrTiO$_3$ film formed by using the Ar/O$_2$ gas as the film forming gas has a nitrogen concentration of approximately $10^{16}$/cm$^3$. In contrast, FIG. 4(b) reveals that the SrTiO$_3$ film formed by using the Ar/O$_2$/N$_2$ gas as the film forming gas includes more nitrogen than the SrTiO$_3$ film formed by using the Ar/O$_2$ gas. In addition, nitrogen is uniformly present in this SrTiO$_3$ film. The nitrogen concentration in this SrTiO$_3$ film calculated on the basis of the depth profile of SIMS is approximately 3 at %.

Figure 5:
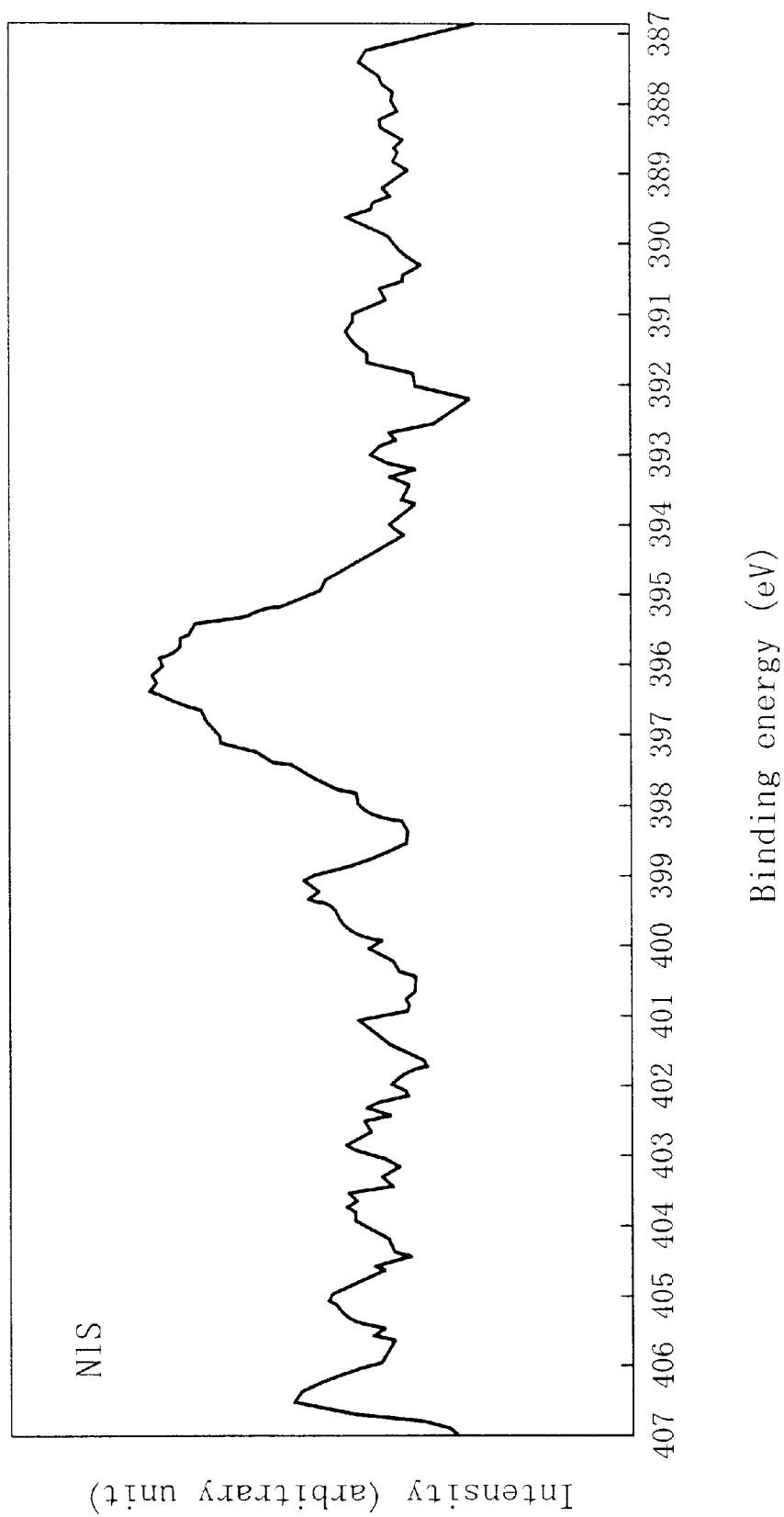
FIG. 5 is a diagram for showing a result of analysis with XPS of a bond state of nitrogen in the $SrTiO_3$ film of Embodiment 1 formed by using an $Ar/O_2/N_2$ gas as a film forming gas.

FIG. 5 is a diagram for showing the result of analysis with X-ray photoelectron spectroscopy (XPS) of a bond state of nitrogen in the SrTiO$_3$ film of this embodiment formed by using the Ar/O$_2$/N$_2$ gas as the film forming gas. In obtaining data shown in this drawing, nitrogen is identified by using the N$_{1S}$ spectrum. In general, nitrogen as a simple substance has a binding energy of 399 through 400 eV. According to the data of FIG. 5, however, nitrogen included in the SrTiO$_3$ film of this embodiment formed by using the Ar/O$_2$/N$_2$ gas is in a bond state with a lower energy of approximately 396 eV, which probably means that the nitrogen is bonded to any metal. Specifically, the nitrogen seems to present within the SrTiO$_3$ film in a state bonded to Sr or Ti. In the (conventional) SrTiO$_3$ film of the comparative example formed by using the Ar/O$_2$ gas as the film forming gas, the concentration of the nitrogen element is approximately $10^{16}$/cm$^3$, and hence, the content of nitrogen is too small to observe the N$_{1S}$ spectrum with XPS.

Figure 6:
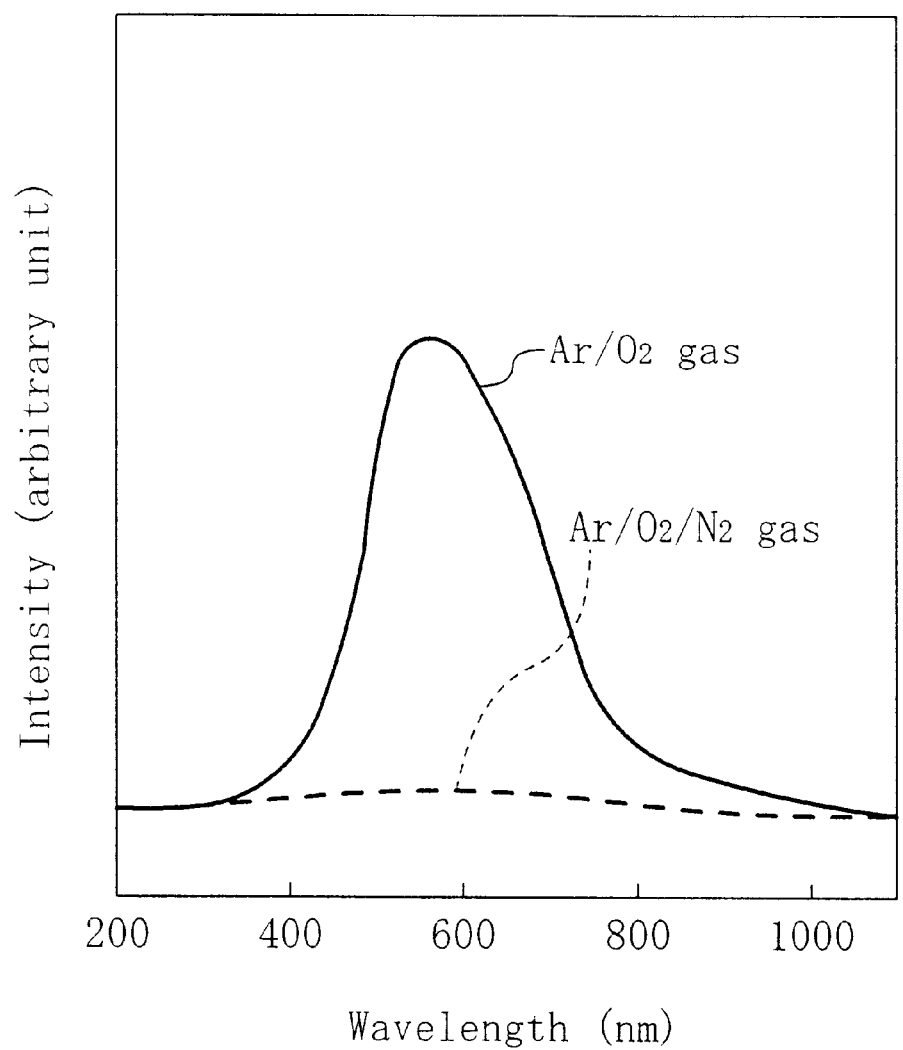
FIG. 6 is a diagram of an emission spectrum obtained as a result of analysis with CL of the $SrTiO_3$ films of the comparative example and Embodiment 1.

FIG. 6 shows emission spectra obtained as a result of analysis with a cathode luminescence (CL) of the SrTiO$_3$ films included in the laminated films having the Pt/SrTiO$_3$/Pt/Ti/glass structure of the comparative example and this embodiment. As shown in FIG. 6, a CL spectrum in the vicinity of a wavelength of 530 nm corresponds to an emission spectrum related to oxygen loss. In the SrTiO$_3$ film of this embodiment formed by using the Ar/O$_2$/N$_2$ gas as the film forming gas, the intensity of the CL spectrum is remarkably lower than in the SrTiO$_3$ film of the comparative example formed by using the Ar/O$_2$ gas as the film forming gas. In other words, it seems that the SrTiO$_3$ film of this embodiment formed by using the Ar/O$_2$/N$_2$ gas includes nitrogen and the nitrogen is bonded to the metal, so as to compensate the harmful effect of the oxygen loss in the SrTiO$_3$ film.

Figure 7B:
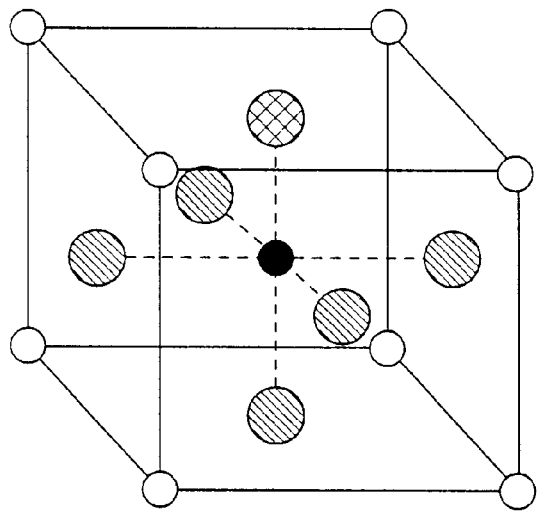
FIGS. 7(a) and 7(b) are diagrams for showing estimated models of crystal structures of $SrTiO_3$ films formed by respectively using an $Ar/O_2$ gas and an $Ar/O_2/N_2$ gas.
Figure 7A:
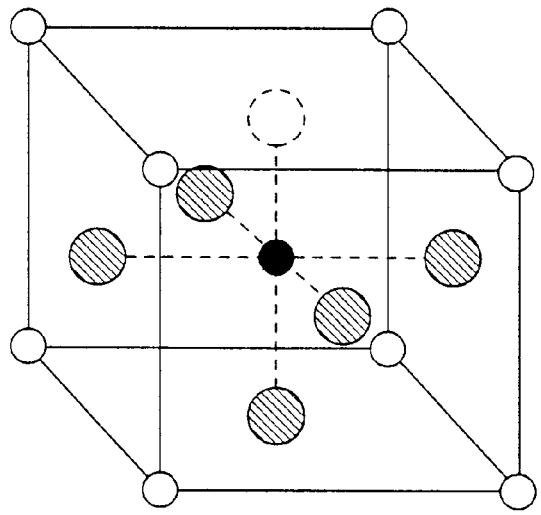

FIGS. 7(a) and 7(b) are diagrams for showing estimated models of the crystal structures of the SrTiO$_3$ films formed by using the Ar/O$_2$ gas and the Ar/O$_2$/N$_2$ gas, respectively. As is shown in FIG. 7(a), in a SrTiO$_3$ lattice of the comparative example formed by using the Ar/O$_2$ gas, a hole (shown with a broken line) is formed due to the oxygen loss. In contrast, in a SrTiO$_3$ lattice of this embodiment formed by the Ar/O$_2$/N$_2$ gas, it seems that nitrogen is substituted for a hole as is shown in FIG. 7(b), or that a nitrogen atom is bonded to a metal atom through any bonding in any position within the lattice. Since the nitrogen atom is linked with a bond of a metal atom unlinked due to the hole, the harmful effect of the oxygen loss can be compensated so as to reduce leakage as described in detail below.

Table 1 shows the results of evaluations of various characteristics of thin film capacitors including the SrTiO$_3$ films formed by using the Ar/O$_2$ gas and the Ar/O$_2$/N$_2$ gas, respectively. A value corresponding to each characteristic listed in this table is obtained at a measurement frequency of 1 kHz, and a leakage current listed in the table is obtained by applying a voltage of +5 V to the top electrode with the bottom electrode grounded.

TABLE 1

Dependence of capacitor characteristics on film forming gas

| Film forming gas for SrTiO$_3$ film | Ar/O$_2$ | Ar/O$_2$/N$_2$ |
|---|---|---|
| $\epsilon$r | 70 | 80 |
| tan δ (%) | 0.7 | 0.4 |
| I (mA/cm$^2$) | 2.1 × 10$^{-6}$ | 2.6 × 10$^{-7}$ |

As listed in Table 1, the SrTiO$_3$ film of the comparative example formed by using the Ar/O$_2$ gas has a dielectric constant of 70, dielectric loss tangent of 0.7% and a current density of 2.1×10$^{-6}$ mA/cm2. In contrast, the SrTiO$_3$ film of this embodiment formed by using the Ar/O$_2$/N$_2$ gas has a dielectric constant of 80, dielectric loss tangent of 0.4% and a current density of 2.6×10$^{-7}$ mA/cm$^2$. In this manner, the SrTiO$_3$ film of this embodiment has a larger dielectric constant, smaller dielectric loss tangent and a smaller leakage current than the conventional SrTiO$_3$ film (of the comparative example). These differences in the characteristic values such as the dielectric loss tangent and the current density between this embodiment and the comparative example are probably derived from the differences in the fine structure and the crystallinity between the SrTiO$_3$ films observed with SEM, SIMS, XPS and CL.

Mechanism of Occurrence of Leakage and Effect Attained by Reducing Leakage

Figure 8:
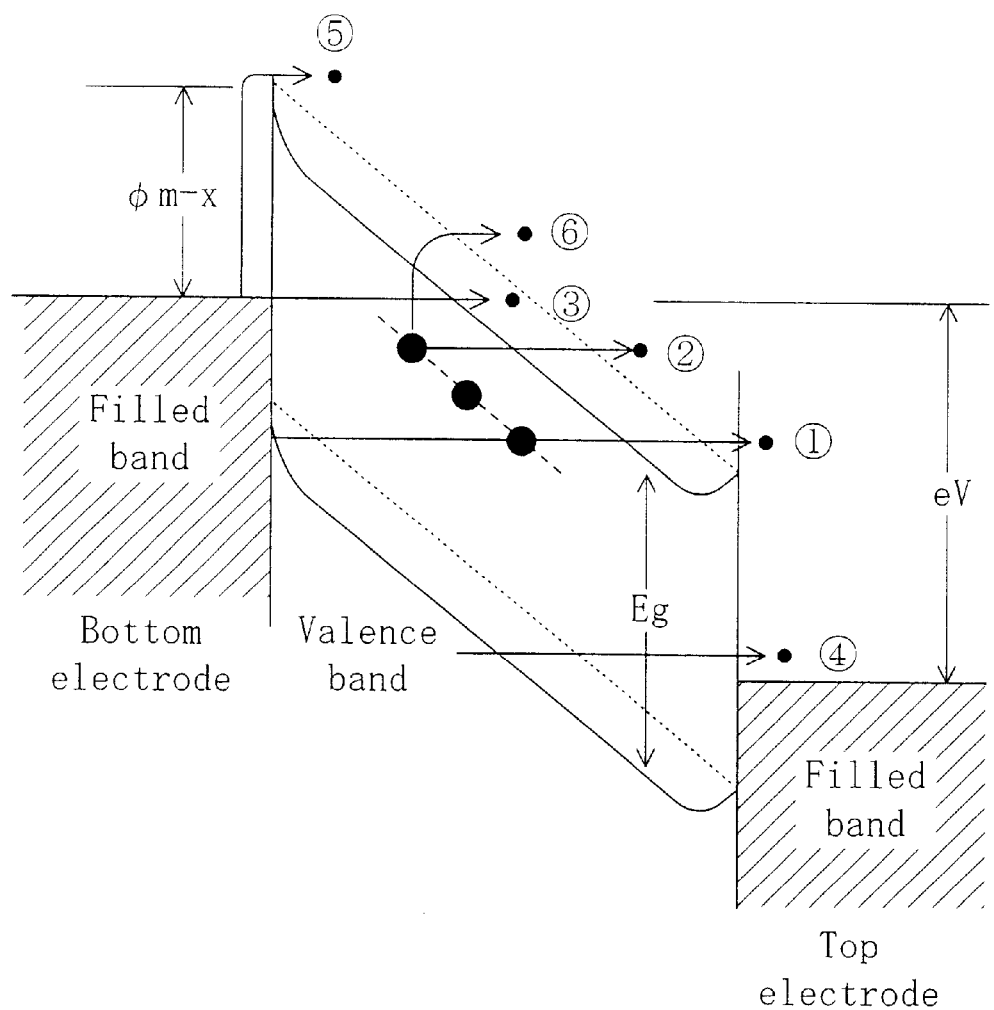
FIG. 8 is a partial band chart for explaining mechanism of leakage in a thin film capacitor including a dielectric film with the $ABO_3$ perovskite structure.

FIG. 8 is a partial band chart for explaining the mechanism of leakage occurring in a thin film capacitor including a dielectric film with the ABO$_3$ perovskite structure such as a SrTiO$_3$ (STO) film. As is shown in FIG. 8, the procedure of occurrence of a leakage current is roughly divided into tunneling through a potential barrier and jump over a potential barrier. The tunneling through a potential barrier is classified into:

① tunneling from a valence band to a conduction band;
② tunneling from an impurity level to a conduction band;
③ tunneling from a bottom electrode (electrode with lower potential) to a conduction band; and
④ tunneling from a valence band to a top electrode (electrode with higher potential).

On the other hand, the jump over a potential barrier is classified into:

⑤ jump from a top electrode to a conduction band owing to the Schottky effect; and
⑥ jump from an impurity level to a conduction band owing to the Poole-Frenkel effect.

It seems that ① the tunneling from a valence band to a conduction band is caused mainly by electrons flowing through a grain boundary, and hence, it is necessary to reduce the area of a grain boundary. The area of a grain boundary can be probably reduced by forming a dielectric film with the ABO$_3$ perovskite structure, such as a SrTiO$_3$ film, oriented along one direction (specifically, along a direction where the film surface accords with the (111) surface orientation), so as to increase the minuteness of the dielectric film.

② The tunneling from an impurity level to a conduction band is caused mainly because oxygen loss formed within a dielectric film having the ABO$_3$ perovskite structure generates donor levels and electrons captured by the donor levels tunnel into the conduction band. Accordingly, the leakage resulting from this tunneling can be reduced by forming a dielectric film having the ABO$_3$ perovskite structure including less donor levels derived from the oxygen loss.

③ The tunneling from a bottom electrode to a conduction band and ④ the tunneling from a valence band to a top electrode are probably caused by electrons piercing from the electrode to the conduction band or from the valence band to the electrode through a space-charge region present on one surface closer to the dielectric film of a Schottky barrier, which is considered to be formed in a contact portion between an electrode and a dielectric film. Accordingly, it is significant to suppress the pierce of the electrons by increasing the width of the space-charge region. In order to increase the width of the space-charge region, it is significant to reduce the carrier concentration in the dielectric film, namely, to reduce lattice defects causing donor levels in the dielectric film.

⑤ The jump from a top electrode to a valence band is probably caused by electrons released beyond the Schottky barrier that is considered to be formed between an electrode and a dielectric film. Accordingly, this electron jump can be suppressed by increasing the height of the Schottky barrier ($\Phi_m$-X), and the height of the Schottky barrier can be increased by increasing the work function $\Phi_m$ of the bottom electrode.

⑥ The jump form an impurity level to a conduction band is probably caused because oxygen loss and the like formed within a perovskite dielectric film generate donor levels and electrons captured by the donor levels jump over a potential difference between the donor levels and the conduction band. Accordingly, leakage resulting from this jump can be reduced by forming a dielectric film including less donor levels derived from the oxygen loss.

As described so far, in order to reduce leakage in a dielectric film having the ABO$_3$ perovskite structure, reduction of donor levels derived from the oxygen loss and reduction of defects such as lattice defects (namely, improvement of crystallinity) are particularly effective.

As is obvious from the aforementioned evaluation results, the SrTiO$_3$ film formed by the fabrication method of this embodiment has a high nitrogen concentration, and nitrogen is incorporated into the crystal lattice to be bonded to Sr or Ti. Since the nitrogen is thus bonded to Sr or Ti, the donor levels derived from the oxygen loss are probably reduced. It seems that the leakage is reduced because the harmful effect of the oxygen loss is thus compensated by the nitrogen.

Furthermore, when nitrogen is incorporated into the oxygen loss in the SrTiO₃ film, the resultant film structure attains good crystallinity and minuteness. A SrTiO₃ film with good crystallinity having a composition close to the stoichiometric composition can be formed by adjusting the atmosphere of sputtering as described below.

In this manner, in the dielectric film having the ABO₃ (wherein A is a group II element and B is a group IV element) perovskite structure of this embodiment, the crystallinity is improved and the donor levels derived from the oxygen loss are reduced owing to the nitrogen included therein. Since the dielectric film can thus attain minuteness, the capacitance is increased, the loss is decreased and a leakage current is reduced. Furthermore, since heat loss under application of a high frequency voltage is smaller as a leakage current is smaller, the dielectric loss tangent (tan δ) is reduced. Accordingly, the fabrication method of this embodiment provides a high quality and highly reliable thin film capacitor with a high breakdown voltage.

When the nitrogen concentration in the SrTiO₃ film exceeds 10 5 at %, the quality of the film is degraded, resulting in lowering all the characteristics of the thin film capacitor. Accordingly, the nitrogen concentration in the SrTiO₃ film is preferably 5 at % or less. Furthermore, the nitrogen concentration in the SrTiO₃ film is preferably higher than a nitrogen content attained without intentionally introducing nitrogen into the dielectric film (namely, approximately $10^{16}/cm^3$).

The dielectric film is preferably made from at least one material capable of attaining a high dielectric constant or spontaneous polarization (ferroelectric property) selected from the group consisting of SrTiO₃, (SrCa)TiO₃, (SrBi) TiO₃, BaTiO₃, PbTiO₃, (PbLa)TiO₃, Pb(ZrTi)O₃ and a substance including any of these materials as a solid-solution element.

The dielectric film is formed preferably by RF magnetron sputtering or ECR magnetron sputtering. The deposition rate of the dielectric film is preferably 10 nm/min. or more from the point of view of fabrication cost. A rare gas included as an inert gas in the film forming gas is preferably at least one selected from the group consisting of He, Ne and Ar.

Relationship Between Deposition Rate and Film Characteristic

Figure 9:
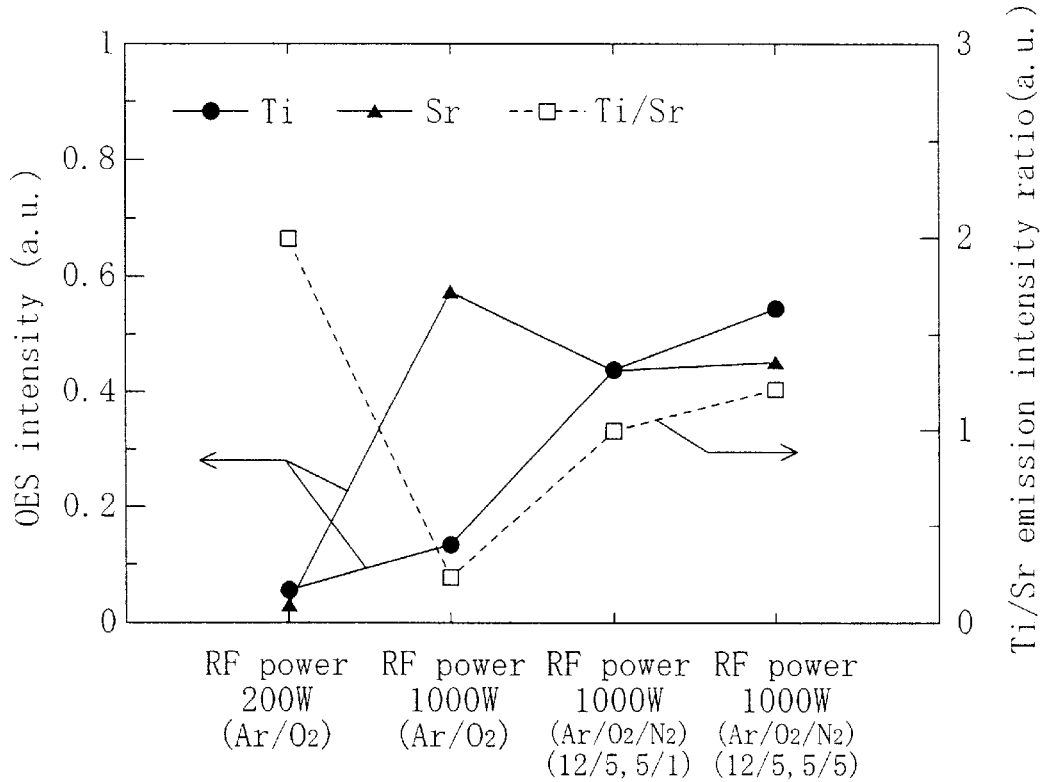
FIG. 9 is a diagram for showing data obtained through analysis with OES of plasma atmospheres for forming the $SrTiO_3$ films of the comparative example and Embodiment 1 with conditions varied.

FIG. 9 is a diagram for showing data obtained by analysis through optical emission spectroscopy (hereinafter referred to as OES) of plasma atmosphere in forming the SrTiO₃ films of this embodiment and the comparative example with varying the RF power (high frequency power) and the composition of the film forming gas. As is shown in FIG. 9, the RF power and the film forming gas employed in forming the SrTiO₃ films are set to four conditions: 200 W and an Ar/O₂ gas; 1000 W and an Ar/O₂ gas; 1000 W and an Ar/O₂/N₂ gas (in a flow ratio of 12:5.5:1) and 1000W and an Ar/O₂/N₂ gas (in a flow ratio of 12:5.5:5). Also in FIG. 9, the ordinate on the left hand side indicates the OES intensity (in arbitrary unit) of Sr and Ti, and the ordinate on the right hand side indicates the Ti/Sr emission intensity ratio, whereas Sr and Ti are different in the detection sensitivity and hence the emission intensity ratio does not correspond to the existing ratio between Sr and Ti in the actual atmosphere. It is empirically known that a SrTiO₃ film having a composition close to the stoichiometric composition can be formed when the Ti/Sr emission intensity ratio thus detected is approximately "2". Furthermore, as the composition of the SrTiO₃ film is closer to the stoichiometric composition, the orientation of the crystal grains is better, which makes easy to attain the desired dielectric constant and ferroelectric property.

As is shown in FIG. 9, in using an Ar/O₂ gas with the RF power set to 200 W, the Ti/Sr emission intensity ratio is "2", which means that a SrTiO₃ film with a composition close to the stoichiometric composition can be formed. However, the concentrations of Ti and Sr in the atmosphere are low, and hence, the deposition rate of the film is too low to be suitably employed in a mass-production process. On the other hand, in using an Ar/O₂ gas with the RF power set to 1000 W, although the deposition rates of Ti and Sr are increased, the Sr concentration is much higher than the Ti concentration, which makes the composition of the SrTiO₃ film largely deviated from the stoichiometric composition. Therefore, it is difficult to attain the desired ferroelectric property. In contrast, in using an Ar/O₂/N₂ gas (in a flow ratio of 12:5.5:1) with the RF power set to 1000 W, not only the Ti and Sr concentrations are higher than in using an Ar/O₂ gas but also the Ti/Sr emission intensity ratio is approximate to "2". Accordingly, under this condition, a SrTiO₂ film having a composition close to the stoichiometric composition can be formed at a high deposition rate. Furthermore, in using an Ar/O₂/N₂ gas (in a flow ratio of 12:5.5:5), namely, when the ratio of the N₂ gas included in the Ar/O₂/N₂ gas is increased with the RF power kept at 1000 W, the Ti/Sr emission intensity ratio is more approximate to "2". The mechanism of this effect is not clear yet, but plasma ions of the N₂ gas may adjust sputtered amounts of the two metals.

Figure 10A:
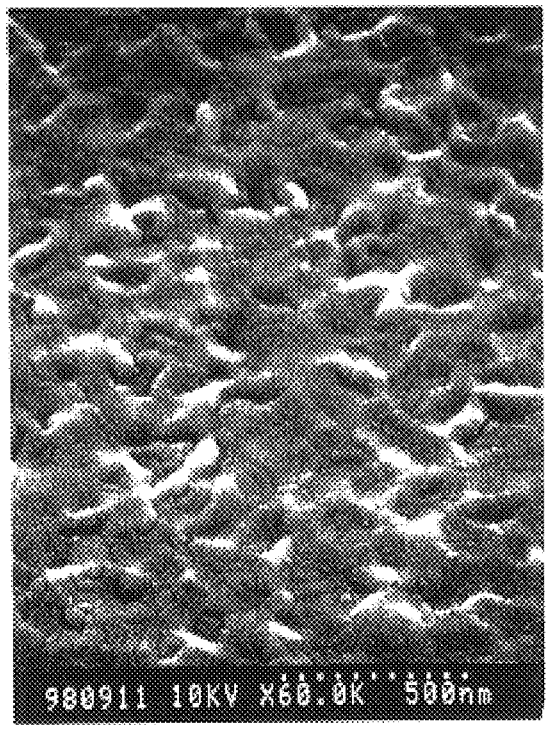
FIGS. 10(a) and 10(b) are SEM photographs of the surfaces of the $SrTiO_3$ films formed by respectively using an $Ar/O_2$ gas and an $Ar/O_2/N_2$ gas as the film forming gas.
Figure 10B:
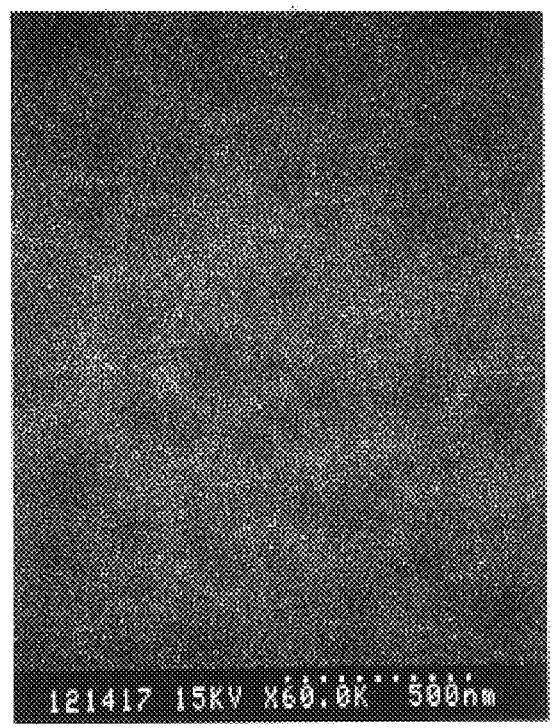

FIGS. 10(a) and 10(b) are photographs obtained with a scanning electron microscope (SEM) of surfaces of a SrTiO₃ film formed at RF power of 800 W by using an Ar/O2 gas as the film forming gas and a SrTiO₃ film formed at the same RF power by using an Ar/O₂/N₂ gas as the film forming gas. As is understood from FIG. 10(a), the SrTiO₃ film formed by using the Ar/O₂ gas has large irregularities on the surface and rough grain boundaries. In contrast, as is understood from FIG. 10(b), the SrTiO₃ film formed by using the Ar/O₂/N₂ gas has small irregularities on the surface and minute grain boundaries.

TABLE 2

Dependence of capacitor characteristics on film forming gas at high deposition rate

| Film forming gas for SrTiO₃ film | Ar/O₂ | Ar/O₂/N₂ |
|---|---|---|
| εr | 75 | 85 |
| tan δ (%) | 1.8 | 0.5 |
| I (mA/cm²) | $5.3 \times 10^{-5}$ | $2.9 \times 10^{-7}$ |

Table 2 above shows various characteristics of thin film capacitors including, as a capacitor dielectric film, the dielectric films respectively formed under the aforementioned two conditions. As is shown in Table 2, in the thin film capacitor including the SrTiO₃ film formed by using the Ar/O₂ gas, the dielectric loss tangent (tan δ) and the leakage (current density) are largely degraded to 1.8% and 5.3×10⁻⁵ mA/cm², respectively as a result of increase of the deposition rate. In contrast, in the thin film capacitor including the SrTiO₃ film formed by using the Ar/O₂/N₂ gas, the dielectric loss tangent (tan δ) and the leakage (current density) are not largely degraded as compared with the data obtained at the RF power of 200 W. These differences in the characteristics of the dielectric loss tangent (tan δ) and the leakage (current density) seem to be derived from the differences in the fine structure and the crystallinity of the SrTiO₃ films observed with SEM. In other words, the data shown in FIGS. 10(a), 10(b) and Table 2 substantiate that degradation in the crystallinity and the like resulting from increase of the deposition rate can be avoided by introducing a nitrogen gas.

It is understood on the basis of these data that in formation of a dielectric film having an $ABO_3$ perovskite structure, even a deposition rate of 10 nm/min. or more can realize a minute dielectric film having high crystallinity and including less donor levels derived from the oxygen loss by introducing nitrogen.

Furthermore, when the $Ar/O_2/N_2$ gas is used instead of the $Ar/O_2$ gas as the film forming gas, the crystallinity can be increased as is shown in FIGS. 3(a) and 3(b). In addition, it is known that the crystallinity can be further increased in using the $Ar/O_2/N_2$ gas by setting the RF power to 1000 W instead of 200 W.

Accordingly, in the fabrication method of this embodiment, by using an $Ar/O_2/N_2$ gas as the film forming gas, namely, by adding a $N_2$ gas to a conventionally used $Ar/O_2$ gas, a $SrTiO_3$ film with high film quality having a composition close to the stoichiometric composition can be formed even at a low temperature with the deposition efficiency increased so as to reduce the fabrication cost. In other words, a thin film capacitor with good characteristics can be formed under conditions employable in using a flexible substrate of an organic material such as polyimide.

These effects can be generally exhibited in depositing, by the sputtering, a dielectric film having the $ABO_3$ perovskite structure other than the $SrTiO_3$ film by using other kinds of target metals.

EMBODIMENT 2

In Embodiment 2, instead of the $SrTiO_3$ dielectric film formed in Embodiment 1, dielectric films are formed from other dielectrics having the $ABO_3$ perovskite structure, namely, $(Sr_{0.85}Ca_{0.15})TiO_3$, $(Sr_{0.9}Bi_{0.1})TiO_3$, $BaTiO_3$, $PbTiO_3$, $(Pb_{0.9}La_{0.1})TiO_3$, $Pb(Zr_{0.5}Ti_{0.5})O_3$, and substances including a dielectric as a solid-solution element, namely, $(Ba_{0.2}Sr_{0.8})TiO_3$ and $(Pb_{0.1}Sr_{0.9})TiO_3$, with the RF power set to 200 W by conducting the same process as in Embodiment 1, namely, by using an $Ar/O_2/N_2$ gas as the film forming gas. In forming each of $(Sr_{0.85}Ca_{0.15})TiO_3$, $(Sr_{0.9}Bi_{0.1})TiO_3$, $BaTiO_3$, $PbTiO_3$, $(Pb_{0.9}La_{0.1})TiO_3$, $Pb(Zr_{0.5}Ti_{0.5})O_3$ and substances including the dielectric as a solid-solution element, namely, $(Ba_{0.2}Sr_{0.8})TiO_3$ and $(Pb_{0.1}Sr_{0.9})TiO_3$, metals included in each dielectric are used as the targets.

TABLE 3

Dependence of capacitor characteristics on dielectric film material

| Dielectric film | Dielectric constant | tan δ (%) | I (mA/cm$^2$) |
|---|---|---|---|
| $SrTiO_3$ | 80 | 0.4 | $2.6 \times 10^{-7}$ |
| $(Sr_{0.85}Ca_{0.15})TiO_3$ | 120 | 0.3 | $1.8 \times 10^{-7}$ |
| $(Sr_{0.9}Bi_{0.1})TiO_3$ | 110 | 0.3 | $2.0 \times 10^{-7}$ |
| $BaTiO_3$ | 100 | 0.5 | $3.2 \times 10^{-7}$ |
| $PbTiO_3$ | 120 | 0.5 | $3.0 \times 10^{-7}$ |
| $(Pb_{0.9}La_{0.1})TiO_3$ | 110 | 0.4 | $2.1 \times 10^{-7}$ |
| $Pb(Zr_{0.5}Ti_{0.5})O_3$ | 100 | 0.5 | $3.1 \times 10^{-6}$ |
| $(Ba_{0.2}Sr_{0.8})TiO_3$ | 120 | 0.3 | $2.2 \times 10^{-7}$ |
| $(Pb_{0.2}Sr_{0.8})TiO_3$ | 90 | 0.5 | $2.3 \times 10^{-7}$ |

Table 3 shows the various characteristics of thin film capacitors (having the structure as shown in FIG. 1) respectively including, as a capacitor dielectric film, the dielectric films having the $ABO_3$ perovskite structure of this embodiment. As is shown in Table 3 above, in each of the thin film capacitors respectively including, as a capacitor dielectric film, the dielectric films having the $ABO_3$ perovskite structure other than the $SrTiO_3$ film, a high dielectric constant, small dielectric loss tangent (tan δ) and small leakage (current density I) can be attained in this embodiment.

Accordingly, in a dielectric film having the $ABO_3$ (wherein A is a group II element and B is a group IV element) perovskite structure, the element A can be at least one material selected from the group consisting of Sr, Ba, Bi, La and Pb, and the element B can be at least one material selected from the group consisting of Ti, Ca, Nb and Zr. Thus, a high quality and highly reliable thin film capacitor with large capacitance, small loss, a small leakage current and a high breakdown voltage can be obtained.

EMBODIMENT 3

In Embodiment 3, a $SrTiO_3$ film is formed by ECR magnetron sputtering instead of the RF magnetron sputtering employed in Embodiment 1. The ECR sputtering is carried out, for example, with a high vacuum chamber evacuated to a $10^{-6}$ Torr (0.0013 Pa) level, in an atmosphere of a mixture of Ar, $O_2$ and $N_2$ (in a flow ratio of 2:1:0.5) at a film forming pressure of $8 \times 10^{-3}$ Torr (1.1 Pa), at RF power of 200 W, at microwave power of 200 W and at a temperature of the substrate of 300° C. The thus obtained $SrTiO_3$ film has a thickness of approximately 300 nm, and the film deposition rate is approximately 3.5 nm/min. The other process conditions are the same as those of Embodiment 1.

Also in this embodiment, a thin film capacitor including the $SrTiO_3$ film as a capacitor dielectric film has characteristics with substantially the same tendency as those of Embodiment 1.

Accordingly, by employing either the RF magnetron sputtering or the ECR magnetron sputtering, a high quality and highly reliable thin film capacitor with large capacitance, small loss, a small leakage current and a high breakdown voltage can be obtained.

EMBODIMENT 4

In Embodiment 4, in the conditions for forming the $SrTiO_3$ film employed in Embodiment 1, the $N_2$ gas is replaced with a $N_2O$ gas. In introducing the $N_2O$ gas, the flow ratio of Ar and $O_2$ in the $Ar/O_2$ gas is set to 4:1. In this embodiment, the RF power is set to 800 W, and the other sputtering conditions are the same as those of Embodiment 1.

TABLE 4

Dependence of capacitor characteristics on film forming gas

| Film forming gas for $SrTiO_3$ film | $Ar/O_2$ | $Ar/O_2/N_2O$ |
|---|---|---|
| εr | 75 | 85 |
| tan δ (%) | 1.8 | 0.6 |
| I (mA/cm$^2$) | $5.3 \times 10^{-5}$ | $3.2 \times 10^{-7}$ |

Table 4 shows the various characteristics of a thin film capacitor including, as a capacitor dielectric film, the dielectric film of this embodiment formed by using the $N_2O$ gas. As shown in Table 4, also the thin film capacitor of this embodiment has the characteristics substantially equivalent to those of the thin film capacitor including the dielectric film formed by using the $N_2$ gas in Embodiment 1.

Accordingly, in forming a dielectric film having the $ABO_3$ perovskite structure, when the $N_2$ gas is replaced with the $N_2O$ gas to be added to the $Ar/O_2$ gas, the harmful effect of the oxygen loss can be compensated by nitrogen. As a result, a minute dielectric film having the $ABO_3$ perovskite structure with good crystallinity can be obtained. When this dielectric film having the $ABO_3$ perovskite structure is used as a capacitor dielectric film, a high quality and highly reliable thin film capacitor with large capacitance, small loss, a small leakage current and a high breakdown voltage can be obtained.

EMBODIMENT 5

In Embodiment 5, a $SrTiO_3$ film is formed by using, as the film forming gas, not only an Ar gas but also another rare gas together with an $O_2$ gas. As a rare gas other than the Ar gas, a He gas, a Ne gas and a Xe gas are examined. The sputtering is carried out under the same conditions as in the comparative example using the $Ar/O_2$ gas in Embodiment 1.

Figure 11:
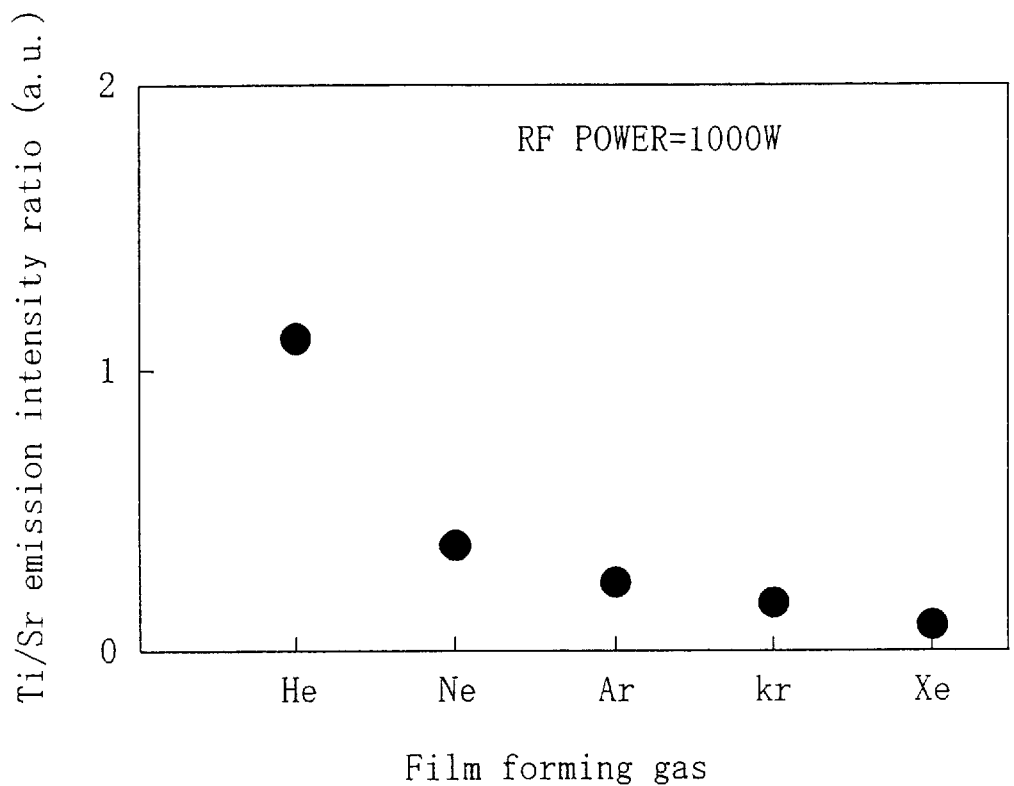
FIG. 11 is a diagram of a Ti/Sr emission intensity ratio in using a He gas, a Ne gas, an Ar gas or a Xe gas together with an $O_2$ gas as the film forming gas.

FIG. 11 is a diagram for showing the result of observation with OES of the Ti/Sr emission intensity ratio in plasma obtained when a He gas, a Ne gas, an Ar gas or a Xe gas is included together with an $O_2$ gas in the film forming gas, whereas the RF power is set to 1000 W. In FIG. 11, in the rare gases plotted along the x-axis direction, the weight is smaller leftward. As the weight of the rare gas is smaller, the Ti/Sr emission intensity ratio is increased to approximate to "2". Specifically, as a lighter rare-gas is used, the plasma atmosphere becomes closer to the conditions for obtaining a $SrTiO_3$ film with the stoichiometric composition. In particular, when a rare gas lighter than an Ar gas is used, the $SrTiO_3$ film can attain a composition closer to the stoichiometric composition and better crystallinity. It is known that as the RF power applied for forming a film is increased, a difference in the Ti/Sr emission intensity ratio between the rare gases becomes larger.

Furthermore, when a $N_2/O_2$ gas is used as the film forming gas supplied to the chamber, the same effect as that attained by a He gas or a Ne gas can be attained.

Figure 12A:
FIGS. 12(a), 12(b) and 12(c) are SEM photographs of $SrTiO_3$ films formed by respectively using a He gas, an Ar gas and a Xe gas as a rare gas included in the film forming gas.
Figure 12B:
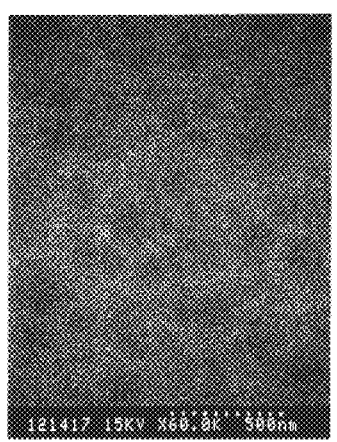
Figure 12C:
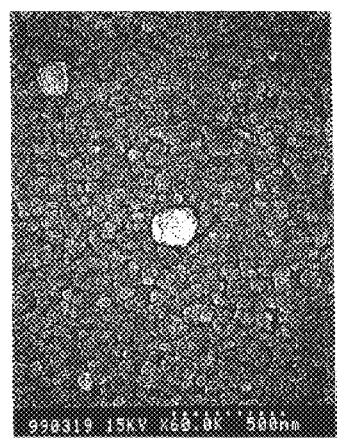

FIGS. 12(a), 12(b) and 12(c) are SEM photographs of surfaces of $SrTiO_3$ films formed by using, as a rare gas included in the film forming gas, a He gas, an Ar gas and a Xe gas, respectively, whereas the RF power is set to 800 W. As is shown in FIGS. 12(a) and 12(b), the $SrTiO_3$ film formed by using a He gas has a flat surface and comparatively minute grain boundaries, and the surface state of the $SrTiO_3$ film formed by using an Ar gas is slightly poorer but can be regarded correspondingly. In contrast, as is shown in FIG. 12(c), a large number of projections are observed on the surface of the $SrTiO_3$ film formed by using a Xe gas. These projections are found to be a compound with a composition including a slightly larger content of Sr, namely, a composition including Sr and Ti in a ratio of 21:19, as a result of composition analysis with an energy dispersion X-ray analyzer (EDX). The degradation in the Ti/Sr emission intensity ratio observed with OES shown in FIG. 11 is probably derived from these projections.

TABLE 5

Dependence of capacitor characteristics on film forming gas

| Film forming gas (rare gas) | Dielectric constant | tan δ (%) | I (mA/cm²) |
| --- | --- | --- | --- |
| He | 80 | 0.4 | $2.3 \times 10^{-7}$ |
| Ne | 80 | 0.4 | $2.5 \times 10^{-7}$ |
| Kr | 65 | 0.6 | $8.0 \times 10^{-7}$ |
| Xe | 40 | 0.8 | $4.2 \times 10^{-6}$ |

Table 5 shows the various characteristics of thin film capacitors including, as a capacitor dielectric film, the $SrTiO_3$ films formed by additionally using a $Ne_2$ gas in this embodiment. The thin film capacitors including the dielectric films formed by respectively using a He gas and a Ne gas have better characteristics than those of the thin film capacitor including the dielectric film formed by using an Ar gas listed in Table 2. The thin film capacitors including the capacitor dielectric films formed by respectively using a Kr gas and a Xe gas are, however, poorer in the dielectric constant, the dielectric loss tangent (tan δ) and the leakage (current density I) than the thin film capacitor including the capacitor dielectric film formed by using an Ar gas. This is probably because the crystallinity is largely degraded due to generation of the projections shown in FIG. 12(c). Also, a Kr gas and a Xe gas are expensive, and hence are not preferably used from the viewpoint of fabrication cost.

Accordingly, when a He gas or a Ne gas lighter than an Ar gas is included as the rare gas used in forming a dielectric film having the $ABO_3$ perovskite structure including nitrogen, the dielectric film can attain a minute $ABO_3$ perovskite structure and good crystallinity with the harmful effect of the oxygen loss compensated. As a result, a high quality and highly reliable thin film capacitor with large capacitance, small loss, a small leakage current and a high breakdown voltage can be obtained.

EMBODIMENT 6

In Embodiment 6, a $SrTiO_3$ film with a smaller thickness than that of Embodiment 1 is formed in order to attain larger capacitance. For example, the $SrTiO_3$ film of this embodiment has a thickness of 100 nm. The sputtering is carried out at RF power of 200 W under the same conditions as those of Embodiment 1. Specifically, an $Ar/O_2/N_2$ gas is used as the film forming gas for forming the $SrTiO_3$ film. For comparison (as a comparative example), a $SrTiO_3$ film is also formed by using an $Ar/O_2$ gas as the film forming gas.

TABLE 6

Dependence of capacitor characteristics on film forming gas in thin dielectric film

| Film forming gas for $SrTiO_3$ film | $Ar/O_2$ | $Ar/O_2/N_2$ |
| --- | --- | --- |
| εr | 70 | 75 |
| tan δ (%) | 0.7 | 0.5 |
| I (mA/cm²) | $4.8 \times 10^{-5}$ | $3.1 \times 10^{-7}$ |

Table 6 shows the various characteristics of thin film capacitors including the $SrTiO_3$ films of this embodiment and the comparative example as capacitor dielectric films.

As is shown in Table 6, in the thin film capacitor including the $SrTiO_3$ film formed by using an $Ar/O_2$ gas, as the thickness is reduced, the leakage (current density I) is increased to $4.8 \times 10^{-5}$ mA/cm² to be larger than the leakage attained when the thickness is 300 nm. Thus, the leakage characteristic is degraded in the comparative example. In contrast, in the thin film capacitor including the $SrTiO_3$ film formed by using an $Ar/O_2/N_2$ gas, the leakage (current density) is not largely degraded. In this manner, by introducing a nitrogen gas as the film forming gas, a leakage current can be suppressed from increasing as the thickness is reduced.

Accordingly, also in forming a dielectric film with the $ABO_3$ perovskite structure with a smaller thickness, a minute dielectric film including less donor levels derived from the oxygen loss can be formed by introducing a nitrogen gas as the film forming gas. As a result, a high quality and highly reliable thin film capacitor with large capacitance, small loss, a small leakage current and a high breakdown voltage can be obtained.

In each of the aforementioned embodiments, a dielectric film having the $ABO_3$ perovskite structure is formed by sputtering, which does not limit the invention, and the invention is applicable to a dielectric film formed by deposition or ion plating.

A gas to be introduced into the atmosphere can be, other than nitrogen described above, elements lighter than Ar, such as helium (He), boron (B), fluorine (F), neon (Ne), carbon (Ca), aluminum (Al), silicon (Si), phosphorus (P), sulfur (S) and chlorine (Cl). In other words, by attaining a condition where any of these elements is present in plasma atmosphere during the sputtering or the like, the harmful effect of the oxygen loss within a dielectric film having the $ABO_3$ perovskite structure can be compensated, so as to effectively exhibit the aforementioned effects of the invention. In particular, when an inert gas such as helium (He) and neon (Ne) is used, the sputtering or the like can be carried out without considering a reaction with the metal element in the plasma atmosphere.

Furthermore, in each of the embodiments, the effects attained by using various inert gases for forming a STO film are described. However, in general, in fabrication of a dielectric film having a perovskite structure with a stoichiometric composition represented by $ABO_3$ including a group II element A, a group IV element B and oxygen O, the existing ratio between the elements A and B can be adjusted to be optimal for attaining the stoichiometric composition by using at least two kinds of sputtering gases having different weights. This is because the elements A and B are sputtered by the at least two kinds of gases having different weights, and hence, a ratio of the sputtered amounts of the elements A and B can be varied by changing a flow ratio between the two kinds of gases.

The dielectric film of this invention is usable not only as a capacitor dielectric film of a thin film capacitor as described in the embodiments but also a gate insulating film of a MIS transistor, a capacitor dielectric film of a DRAM, a ferroelectric film serving as a data holding film in a FeRAM, a ferroelectric film of a transistor such as a MFIS transistor, or the like. Also when it is used as a ferroelectric film, large residual polarization can be attained owing to its high orientation. Also, since a leakage current is reduced due to the compensation of the harmful effect of the oxygen loss in the dielectric film, the ferroelectric film can be effectively polarized by a voltage applied between top and bottom electrodes, resulting in attaining large residual polarization.

What is claimed is:

1. A condenser comprising:
    a substrate composed of an organic material;
    a first electrode provided on the substrate;
    a dielectric film having a perovskite structure, which includes a metal element A, a metal element B, oxygen O, and nitrogen N of less than or equal to 5%; and
    a second electrode that is provided on the dielectric film and opposed to the first electrode;
    wherein the element A is at least one material selected from the group consisting of Sr, Ba, Bi, La, and Pb and the element B is at least one material selected from the group consisting of Ti, Ca, Nb, and Zr.

2. The condenser of claim 1, wherein said nitrogen is bonded to at least one of said element A and said element B.

3. The condenser of claim 1, wherein said element A is at least one material selected from the group consisting of Sr, Ba, Bi, La and Pb.

4. The condenser of claim 1, wherein said element B is at least one material selected from the group consisting of Ti, Ca, Nb, and Zr.

* * * * *